US008592108B2

(12) United States Patent
Fujimura et al.

(10) Patent No.: US 8,592,108 B2
(45) Date of Patent: Nov. 26, 2013

(54) METHOD FOR DESIGN AND MANUFACTURE OF PATTERNS WITH VARIABLE SHAPED BEAM LITHOGRAPHY

(71) Applicant: D2S, Inc., San Jose, CA (US)

(72) Inventors: Akira Fujimura, Saratoga, CA (US); Harold Robert Zable, Palo Alto, CA (US)

(73) Assignee: D2S, Inc., San Jose, CA (US)

( * ) Notice: Subject to any disclaimer, the term of this patent is extended or adjusted under 35 U.S.C. 154(b) by 0 days.

(21) Appl. No.: 13/710,426

(22) Filed: Dec. 10, 2012

(65) Prior Publication Data

US 2013/0101941 A1    Apr. 25, 2013

Related U.S. Application Data

(63) Continuation of application No. 13/300,601, filed on Nov. 20, 2011, now Pat. No. 8,329,365, which is a continuation of application No. 12/750,709, filed on Mar. 31, 2010, now Pat. No. 8,062,813, which is a continuation-in-part of application No. 12/540,328, filed on Aug. 12, 2009, now Pat. No. 8,017,286, and a continuation-in-part of application No. 12/202,364, filed on Sep. 1, 2008, now Pat. No. 7,759,026, and a continuation-in-part of application No. 12/473,241, filed on May 27, 2009, now Pat. No. 7,754,401.

(51) Int. Cl.
*G03F 1/20*    (2012.01)
*G03C 5/00*    (2006.01)

(52) U.S. Cl.
USPC ............... 430/5; 430/30; 430/296; 430/942; 716/53

(58) Field of Classification Search
USPC ........................ 430/5, 30, 296, 942; 716/53
See application file for complete search history.

(56) References Cited

U.S. PATENT DOCUMENTS

| | | | |
|---|---|---|---|
| 4,712,013 A | 12/1987 | Nishimura | |
| 5,082,762 A | 1/1992 | Takahashi | |
| 5,804,339 A | 9/1998 | Kim | |
| 5,885,747 A | 3/1999 | Yamasaki et al. | |
| 6,049,085 A | 4/2000 | Ema | |
| 6,087,046 A | 7/2000 | Nakasuji | |
| 6,291,119 B2 | 9/2001 | Choi et al. | |
| 6,544,700 B2 | 4/2003 | Ogino | |
| 6,610,989 B1 | 8/2003 | Takahashi | |
| 6,677,089 B2 | 1/2004 | Ogino et al. | |
| 6,982,135 B2 | 1/2006 | Chang et al. | |
| 7,754,401 B2 | 7/2010 | Fujimura et al. | |
| 7,824,828 B2 | 11/2010 | Fujimura et al. | |
| 7,901,850 B2 | 3/2011 | Fujimura et al. | |
| 7,981,575 B2 * | 7/2011 | Fujimura et al. | 430/5 |
| 8,017,289 B2 * | 9/2011 | Fujimura et al. | 430/30 |
| 8,039,176 B2 | 10/2011 | Fujimura et al. | |
| 8,062,813 B2 | 11/2011 | Zable et al. | |
| 8,137,871 B2 | 3/2012 | Zable et al. | |
| 8,202,672 B2 * | 6/2012 | Fujimura et al. | 430/5 |
| 8,202,673 B2 * | 6/2012 | Fujimura et al. | 430/30 |
| 8,304,148 B2 * | 11/2012 | Fujimura et al. | 430/5 |
| 2002/0036273 A1 | 3/2002 | Okino | |
| 2006/0073686 A1 | 4/2006 | Zach et al. | |
| 2007/0114453 A1 | 5/2007 | Emi | |
| 2007/0187624 A1 | 8/2007 | Suzuki | |
| 2008/0116397 A1 | 5/2008 | Yoshida et al. | |
| 2008/0116398 A1 | 5/2008 | Hara et al. | |
| 2008/0118852 A1 | 5/2008 | Mitsuhashi | |

FOREIGN PATENT DOCUMENTS

| | | |
|---|---|---|
| JP | 1992155337 | 5/1992 |
| JP | 11233401 | 8/1999 |
| JP | 2008066441 | 3/2008 |
| KR | 1020080001438 A | 1/2008 |

OTHER PUBLICATIONS

Bloecker, M. et al., "Metrics to Assess Fracture Quality for Variable Shaped Beam Lithography", Proceedings of SPIE, vol. 6349 (Oct. 2006), pp. 63490Z-1-63490Z-10, SPIE, P.O. Box 10, Bellingham, WA. 98227, U.S.A.
International Preliminary Report on Patentability and Written Opinion dated Mar. 10, 2011 for PCT Patent Application No. PCT/US2009/053327.
International Preliminary Report on Patentability and Written Opinion dated Mar. 10, 2011 for PCT Patent Application No. PCT/US2009/053328.
International Preliminary Report on Patentability and Written Opinion dated Mar. 10, 2011 for PCT Patent Application No. PCT/US2009/054229.
International Preliminary Report on Patentability and Written Opinion dated Mar. 10, 2011 for PCT Patent Application No. PCT/US2009/054239.
Notice of Allowance and Fee(s) due dated Apr. 5, 2011 for U.S. Appl. No. 12/473,248.
Notice of Allowance and Fee(s) due dated Jan. 20, 2011 for U.S. Appl. No. 12/473,265.
Office Action dated Aug. 20, 2010 for U.S. Appl. No. 12/202,365.
Office action dated Mar. 17, 2011 for U.S. Appl. No. 12/540,322.
Office Action dated Mar. 18, 2011 for U.S. Appl. No. 12/540,321.
Office Action dated Mar. 2, 2011 for U.S. Appl. No. 12/987,994.
Office Action dated Mar. 30, 2012 for U.S. Appl. No. 13/316,564.
Office Action dated Mar. 31, 2011 for U.S. Appl. No. 12/540,328.

(Continued)

*Primary Examiner* — Christopher Young
(74) *Attorney, Agent, or Firm* — The Mueller Law Office, P.C.

(57) ABSTRACT

In the field of semiconductor device production, a method and system for fracturing or mask data preparation or optical proximity correction are disclosed, in which a target maximum dosage for a surface is input, and where a plurality of variable shaped beam (VSB) shots is determined that will form a pattern on the surface, where at least two of the shots partially overlap, and where the plurality of shots are determined so that the maximum dosage produced on the surface is less than the target dosage. A similar method is disclosed for manufacturing an integrated circuit.

27 Claims, 11 Drawing Sheets

(56) References Cited

OTHER PUBLICATIONS

Chinese Office Action dated Jan. 14, 2013 for Chinese Application No. 200980134188.6.

Notice of Allowance dated Mar. 26, 2013 for U.S. Appl. No. 13/650,618.
Office Action dated May 24, 2013 for U.S. Appl. No. 13/329,315.
Japanese Office Action dated Oct. 8, 2013 for Japanese Patent Application No. 2011-525091.

* cited by examiner

US 8,592,108 B2

METHOD FOR DESIGN AND MANUFACTURE OF PATTERNS WITH VARIABLE SHAPED BEAM LITHOGRAPHY

RELATED APPLICATIONS

This application is a continuation of U.S. patent application Ser. No. 13/300,601 filed Nov. 20, 2011 entitled "Method For Design And Manufacture Of Diagonal Patterns With Variable Shaped Beam Lithography" and issued as U.S. Pat. No. 8,329,365, which is a continuation of U.S. patent application Ser. No. 12/750,709 filed Mar. 31, 2010 entitled "Method For Design And Manufacture Of A Reticle Using A Two-Dimensional Dosage Map And Charged Particle Beam Lithography" and issued as U.S. Pat. No. 8,062,813, both of which are hereby incorporated by reference for all purposes. U.S. patent application Ser. No. 12/750,709: 1) is a continuation-in-part of U.S. patent application Ser. No. 12/540,328 filed Aug. 12, 2009 entitled "Method For Design and Manufacture of a Reticle Using a Two-Dimensional Dosage Map and Charged Particle Beam Lithography" and issued as U.S. Pat. No. 8,017,286; 2) is a continuation-in-part of U.S. patent application Ser. No. 12/202,364 filed Sep. 1, 2008 entitled "Method and System for Manufacturing a Reticle Using Character Projection Particle Beam Lithography" and issued as U.S. Pat. No. 7,759,026; 3) is a continuation-in-part of U.S. patent application Ser. No. 12/473,241 filed May 27, 2009, entitled "Method for Manufacturing a Surface and Integrated Circuit Using Variable Shaped Beam Lithography" and issued as U.S. Pat. No. 7,754,401; and 4) is related to U.S. patent application Ser. No. 12/540,323 filed Aug. 12, 2009, entitled "Method For Design And Manufacture Of A Reticle Using Variable Shaped Beam Lithography" and issued as U.S. Pat. No. 7,799,489; all of which are hereby incorporated by reference for all purposes.

BACKGROUND OF THE DISCLOSURE

The present disclosure is related to lithography, and more particularly to the design and manufacture of a surface which may be a reticle, a wafer, or any other surface, using charged particle beam lithography.

In the production or manufacturing of semiconductor devices, such as integrated circuits, optical lithography may be used to fabricate the semiconductor devices. Optical lithography is a printing process in which a lithographic mask or photomask manufactured from a reticle is used to transfer patterns to a substrate such as a semiconductor or silicon wafer to create the integrated circuit. Other substrates could include flat panel displays or even other reticles. Also, extreme ultraviolet (EUV) or X-ray lithography are considered types of optical lithography. The reticle or multiple reticles may contain a circuit pattern corresponding to an individual layer of the integrated circuit and this pattern can be imaged onto a certain area on the substrate that has been coated with a layer of radiation-sensitive material known as photoresist or resist. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Eventually, a combination of multiples of devices or integrated circuits will be present on the substrate. These integrated circuits may then be separated from one another by dicing or sawing and then may be mounted into individual packages. In the more general case, the patterns on the substrate may be used to define artifacts such as display pixels or magnetic recording heads.

In the production or manufacturing of semiconductor devices, such as integrated circuits, maskless direct write may also be used to fabricate the semiconductor devices. Maskless direct write is a printing process in which charged particle beam lithography is used to transfer patterns to a substrate such as a semiconductor or silicon wafer to create the integrated circuit. Other substrates could include flat panel displays, imprint masks for nano-imprinting, or even reticles. Desired patterns of a layer are written directly on the surface, which in this case is also the substrate. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Some of the layers may be written using optical lithography while others may be written using maskless direct write to fabricate the same substrate. Eventually, a combination of multiples of devices or integrated circuits will be present on the substrate. These integrated circuits are then separated from one another by dicing or sawing and then mounted into individual packages. In the more general case, the patterns on the surface may be used to define artifacts such as display pixels or magnetic recording heads.

Two common types of charged particle beam lithography are variable shaped beam (VSB) and character projection (CP). In VSB charged particle beam lithography, a precise electron beam is shaped and steered so as to expose a resist-coated surface, such as the surface of a wafer or the surface of a reticle. These shapes are simple shapes, usually limited to rectangles of certain minimum and maximum sizes and with sides which are parallel to the axes of a Cartesian coordinate plane, and triangles with their three internal angles being 45 degrees, 45 degrees, and 90 degrees of certain minimum and maximum sizes. At pre-determined locations, doses of electrons are shot into the resist with these simple shapes. The total writing time for this type of system increases with the number of shots. In CP charged particle beam lithography, there is a stencil in the system that has in it a variety of shapes which may be rectilinear, arbitrary-angled linear, circular, annular, part circular, part annular, or arbitrary curvilinear shapes, and which may be a connected set of complex shapes or a group of disjointed sets of a connected set of complex shapes. An electron beam can be shot through the stencil to efficiently produce more complex patterns (i.e. characters) on the reticle. In theory, such a system can be faster than a VSB system because it can shoot more complex shapes with each time-consuming shot. Thus, an E shot with a VSB system takes four shots, but the same E can be shot with one shot with a character projection system. Note that VSB systems can be thought of as a special (simple) case of character projection, where the characters are just simple characters, usually rectangles or 45-45-90 triangles. It is also possible to partially expose a character. This can be done by, for instance, blocking part of the particle beam. For example, the E described above can be partially exposed as an F or an I, where different parts of the beam are cut off by an aperture.

The photomasks used for optical lithography are manufactured from reticles onto which a pattern has been formed. There are a number of technologies used for forming patterns on a reticle, including optical lithography and charged particle beam lithography. The most commonly-used system is a VSB charged particle beam system. Reticle writing typically involves multiple passes whereby the given shape on the reticle is written and overwritten. Typically, two to four passes are used to write a reticle to average out precision errors in the charged particle beam system, allowing the creation of more accurate photomasks. Conventionally, within a single pass the constituent shapes do not overlap. Multi-pass writing has a disadvantage of increasing the total time required for the charged particle beam system to form the pattern on the reticle. This extra time increases the cost of the reticles and the resulting photomasks. At present, no available CP charged particle beam system is suitable for use in making photomasks.

When using charged particle beam lithography either for making reticles or for direct write, individual doses or shots of charged particles are conventionally designed to avoid overlap wherever possible, and for multi-pass writing, to avoid overlap within a single pass. The dosage is assumed to be the same, or "normal," at all parts of the formed pattern. This greatly simplifies calculation of how the resist on the reticle will register the pattern. Because of the assumed normal dosage, the fracturing programs that assign VSB shots conventionally do not output dosage information.

The cost of charged particle beam lithography is directly related to the time required to expose a pattern on a surface, such as a reticle or wafer. The exposure time is related to the number of shots required to produce the pattern. Patterns can often be formed in fewer shots if the shots are allowed to overlap. Additionally, patterns can be formed in fewer shots if the union of shots is allowed to deviate from the target pattern. When these techniques are used, calculation of the pattern that will be registered by the resist is more complicated. Charged particle beam simulation may be used to determine the pattern that will be registered by the resist. Charged particle beam simulation, which may include simulation of various charged particle beam writing and resist effects, is a compute-intensive process, however. It is impractical to simulate the pattern for an entire integrated circuit, and then to re-simulate the pattern every time a proposed charged particle beam shot is changed.

It would therefore be advantageous to be able to easily determine how resist on a surface such as a wafer or reticle will register a pattern formed by a plurality of charged particle beam shots. This would enable the use of overlapping shots and variable shot dosages. With overlapping shots and variable dosages, patterns can be formed on a surface with fewer shots, thus reducing the cost of forming the pattern on a surface such as a reticle or a wafer, and consequently reducing the cost of manufacturing photomasks and semiconductor devices.

SUMMARY OF THE DISCLOSURE

A method and system for fracturing or mask data preparation or optical proximity correction is disclosed, in which a target maximum dosage for a surface is input, and where a plurality of variable shaped beam (VSB) shots is determined that will form a pattern on the surface, where at least two of the shots partially overlap, and where the plurality of shots is determined so that the maximum dosage produced on the surface is less than the target dosage.

A method for manufacturing an integrated circuit is also disclosed, in which a target maximum dosage for a reticle is input, and where a plurality of variable shaped beam (VSB) shots is determined that will form a pattern on the reticle, where at least two of the shots partially overlap, where the plurality of shots is determined so that the maximum dosage produced on the reticle is less than the target dosage, and where the pattern is formed on the reticle with the plurality of VSB shots.

These and other advantages of the present disclosure will become apparent after considering the following detailed specification in conjunction with the accompanying drawings.

DETAILED DESCRIPTION OF THE EMBODIMENTS

Figure 1:
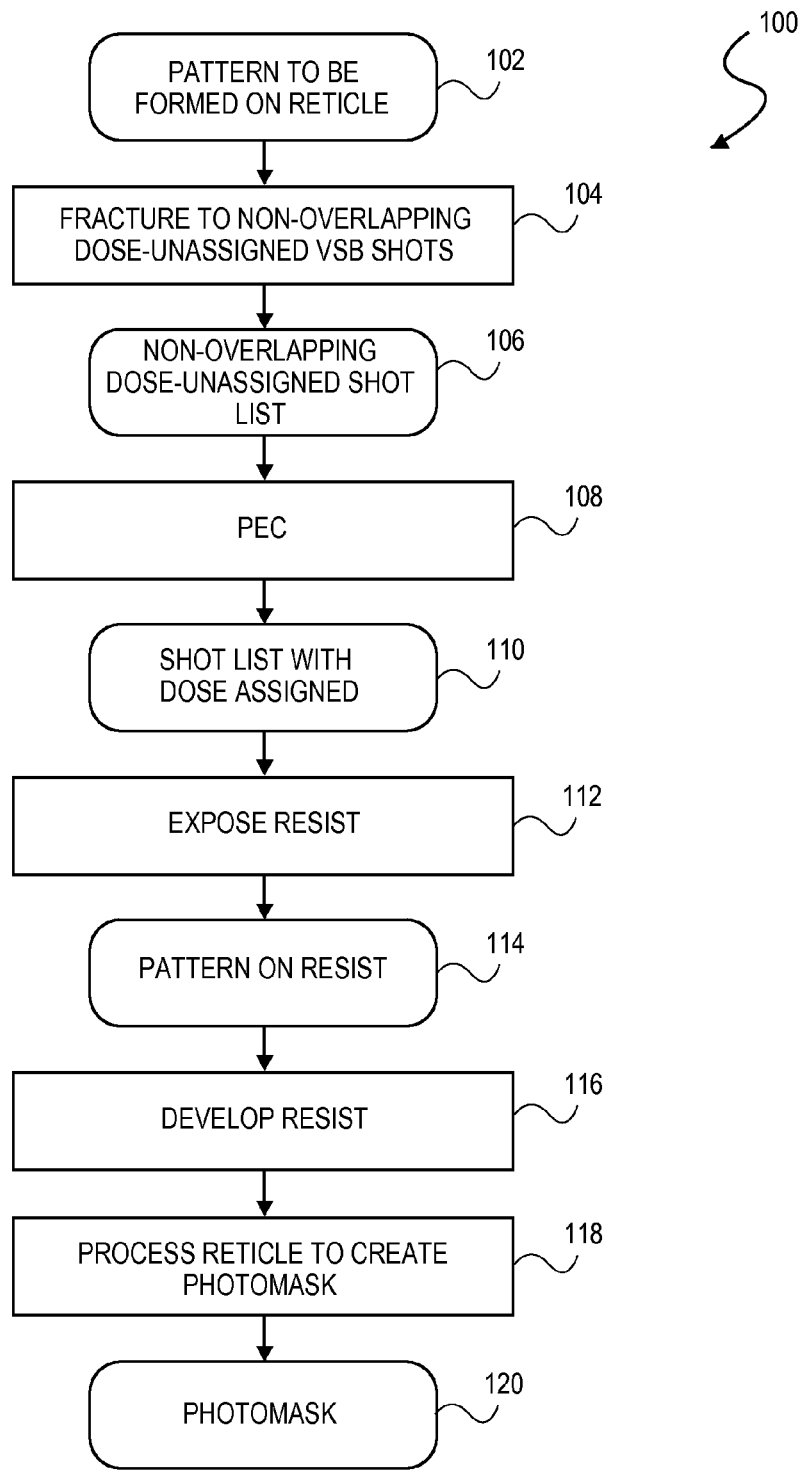
FIG. 1 illustrates a conceptual flow diagram of a conventional method for manufacturing a reticle and photomask.

FIG. 1 illustrates a conceptual flow diagram 100 of a conventional method for making a photomask. The input to the process is a computer representation 102 of a desired pattern that is to be formed on a reticle from which the photomask can be manufactured. In step 104 the pattern is fractured into a set of non-overlapping shapes, such as rectangles and triangles, for exposure using a VSB charged particle beam system. The result of step 104 is a shot list 106, in which the shots are non-overlapping. All shots are assumed to have a normal dosage, and no dosage information is contained in shot list 106. In step 108 proximity effect correction (PEC) is performed, which assigns a dosage to each shot in the shot list, and which may also slightly adjust the placement of the shots. Step 108 may also include other corrections which perform dosage adjustments. The output of step 108 is a final shot list 110 which includes dosage information. In step 112 a charged particle beam system uses the shot list 110 to expose resist with which the reticle has been coated, thereby forming a pattern 114 on the resist. In step 116 the resist is developed. Through further processing steps 118 the reticle is transformed into a photomask 120.

Variations of the FIG. 1 method exist. In one variation of this process, called multi-pass exposure, the entire pattern is exposed once, and then exposed a second time, called two-pass exposure. More than two passes may also be used. Multi-pass writing may be used to reduce non-ideal writing effects such as resist heating, resist charging and field-to-field misalignment. In multi-pass writing, the dosage for each pass is proportionately lower than for single-pass writing, the goal being that the sum of the doses for all passes will be a normal dose for all parts of the pattern. Conventionally, therefore, shot overlap within a pass is avoided. In another variation of the FIG. 1 method, PEC step 108 is performed by the charged particle beam system itself, so PEC step 108 and the expose resist step 112 are combined.

Figure 3:
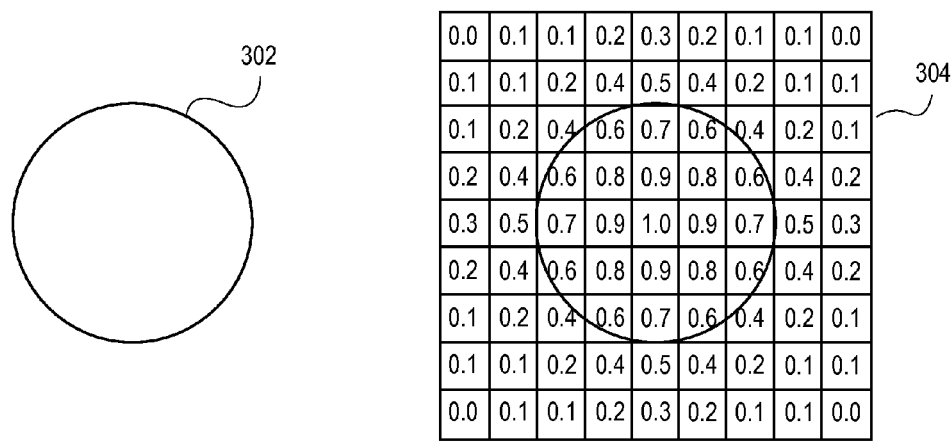
FIG. 3 illustrates a circular pattern, and an example of a dosage map for a circular shot.

FIG. 3 illustrates an example of how a dosage map 304 can be used to show the dosage of a CP shot used to form a circular pattern 302 on a resist-coasted surface. The area in the vicinity of the circle has been divided into a grid of squares, where each square represents a point or sample point in the Cartesian plane where the dosage will be calculated. The size of the grid relative to the circle in this example is larger than would be typical, and is used for illustration. This grid becomes a dosage map by calculating and recording the charged particle dosage for each sample point. Charged particle beam simulation may be used to calculate the dosage in each grid square. The nominal dosage of the CP shot in this example is 1.0, meaning 1.0 times a normal dosage. The blur of the charged particle beam caused by forward scattering of the charged particles, Coulomb effect and other physical, chemical and electromagnetic effects causes a gradual falloff of dosage around the edges of the circular CP shot. The resist threshold is that dosage level above which the resist will register a pattern. If a resist with a threshold of approximately 0.6 is used, a pattern similar to the target pattern will be registered by the resist. In the example of FIG. 3, the grid is too coarse to precisely determine the shape of the pattern that will be registered by the resist. The use of a finer grid allows a more accurate calculation of the registered pattern, but also requires more computational effort to calculate. Additionally, since the dosage across a single grid square varies, any of a variety of conventions can be used in calculating the grid dosage value. The calculated dosage for each grid may, for example, represent the average dosage over the area of the grid, or may represent the dosage in the lower-left corner of the grid square, or may represent the dosage in the center of the grid square. Some other convention may also be used. The shot information, including shot dosage, shot shape if VSB, shot location on the stencil if CP, partial character exposure information if CP, and the dosage map information can be stored in a glyph library, so that the dosage map for other shots which match this shot's shape and dosage can be quickly accessed. Glyph creation is, in fact, the process of calculating a dosage map for a shot or group of shots and storing the shot information and calculated dosage map for future use. The calculated dosage map may be stored either as a two-dimensional matrix of dosage values as shown in FIG. 3, or in a different format, such as a set of instructions for creating a two-dimensional set of dosage values.

Figure 4:
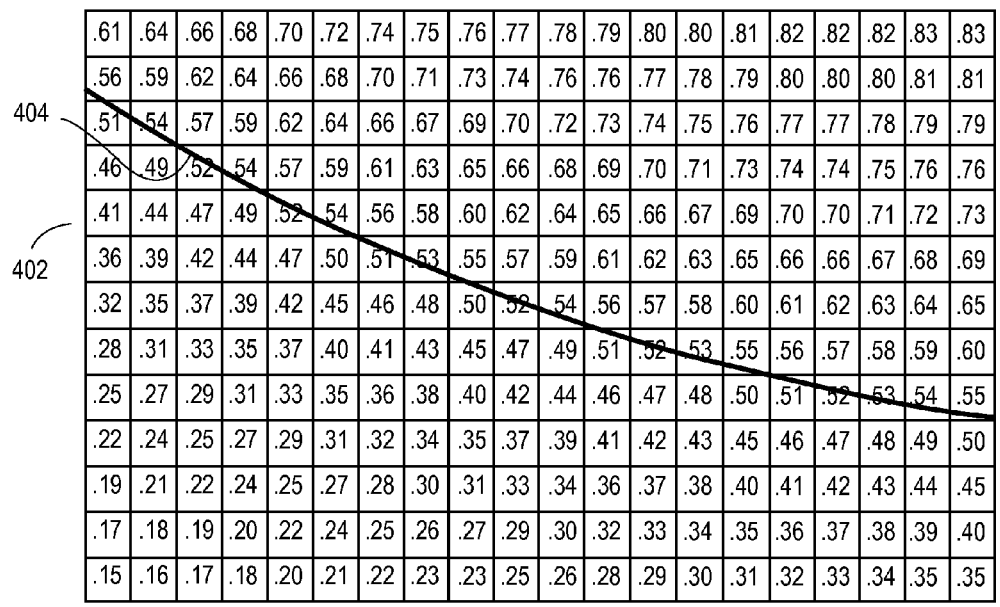
FIG. 4 illustrates a portion of a 200 nm diameter circular pattern and dosage map, using a 4 nm grid.

FIG. 4 illustrates a grid map 402 showing an open arc 404. The arc 404 represents a portion of a 200 nm circular pattern, and the grid map 402 is a portion of a grid map for the circular pattern using a 4 nm grid. The nominal shot dosage is 1.0. A resist threshold of 0.5 is used in this example. This illustrates the large number of grid calculations that a fine grid can require even for a small pattern. Grid sizes between 1 nm and 40 nm, in the scale of a surface, may be useful for calculating dosages for patterns for modern semiconductor processes. Larger grid sizes, such between 50 nm and 1 micron, may be used for calculation of longer-range exposure effects such as backscatter and fogging, and may also be more appropriate for manufacturing patterns for other products.

Figure 5:
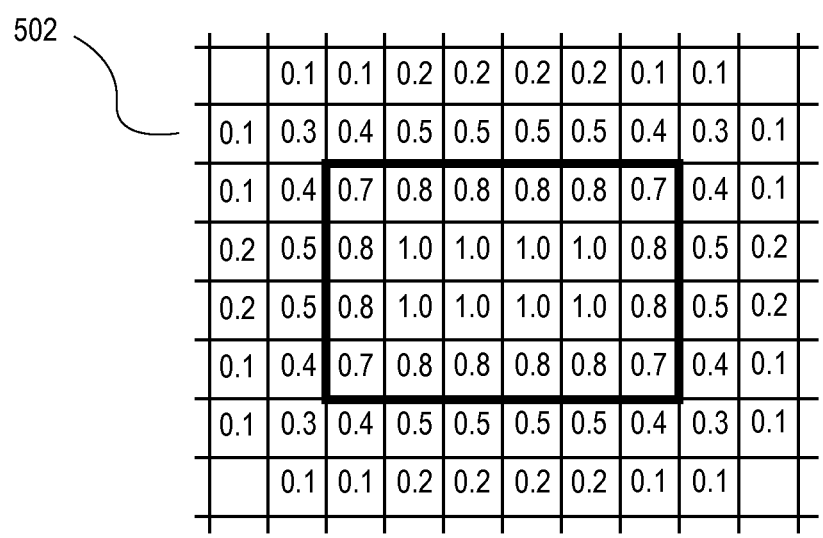
FIG. 5 illustrates an exemplary dosage map for a rectangular shot.
Figure 6:
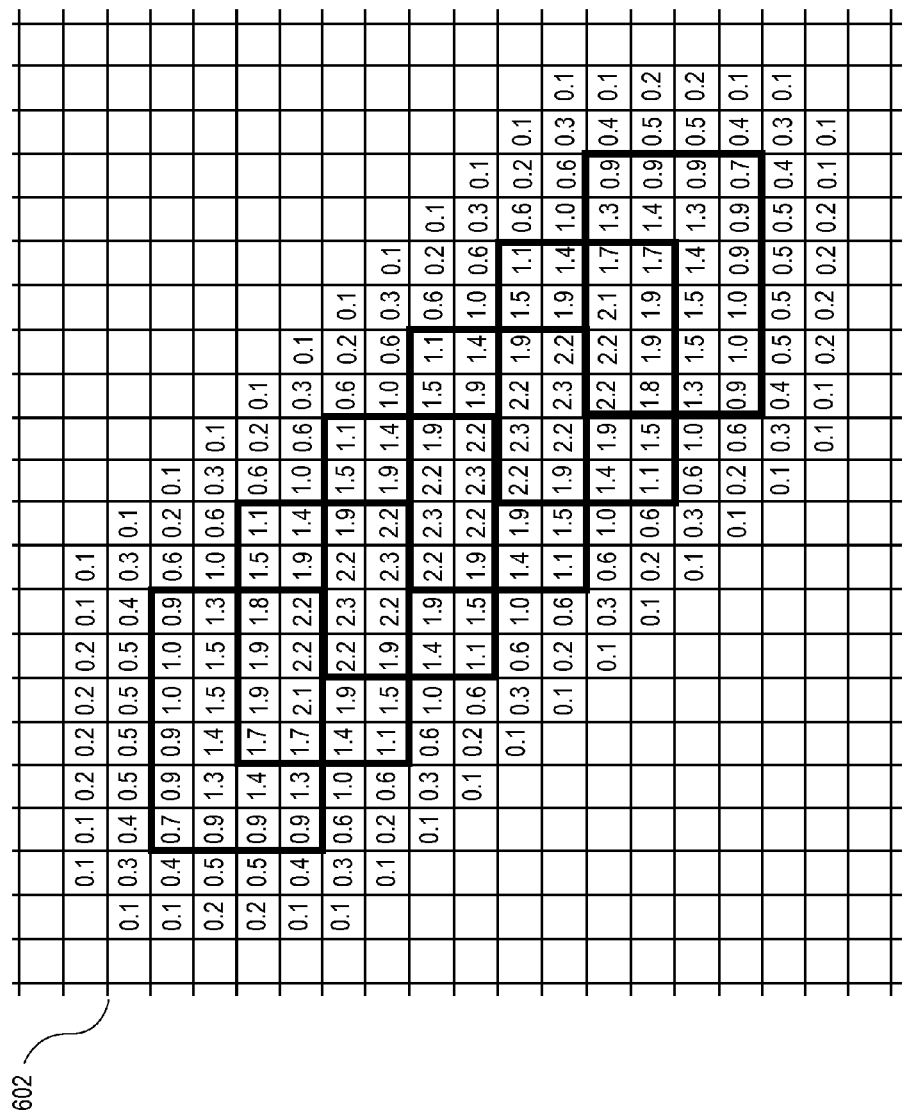
FIG. 6 illustrates a dosage map for a set of six overlapping rectangular shots of the type of FIG. 5.

FIG. 5 and FIG. 6 illustrate how dosages for multiple shots may be combined as an embodiment of the present disclosure. FIG. 5 shows a two-dimensional dosage map 502 for a single rectangular VSB shot. The calculation of the shot dosage map 502 may be accomplished using charged particle beam simulation. The nominal shot dosage is 1.0 in this example. Use of a resist with a threshold of 0.6 will cause a pattern similar to the rectangle to be registered on the resist. FIG. 6 illustrates a dosage map 602 which may result from a set of six overlapping shots onto a resist-coated target surface, such as a reticle or a semiconductor wafer substrate. Dosage map 602 is a combination of six dosage maps of the type 502. The nominal outlines of the six shots are shown. The combination of dosage maps can be done by creating a dosage map 602 for the target surface, and then combining each shot dosage map into the target surface dosage map. The combination process involves aligning each shot dosage map within the Cartesian coordinate space of the target surface dosage map, then applying a mathematical operation or set of operations, such as addition, to combine the dosage value for each grid position of the shot dosage map into the dosage value for the corresponding grid position in the target surface dosage map. In this example the outlines from each of the six rectangular shots indicate how each of the six shot dosage maps are aligned within the Cartesian coordinate space of the target surface dosage map 602. In this example, the mathematical operation used is simple addition. Dosage maps may also be combined using more complex sets of mathematical operations. For example, the combination operation could incorporate calculation of resist charging, which can cause translation and deformation of a shot due to the negative charge which has accumulated on the resist from temporally recent and geometrically nearby shots. In one embodiment the created target surface dosage map 602 may initially contain no shot information. The target dosage map 602 may be empty, with all entries having zero dosage, or the target dosage map 602 may be initialized with an estimate for the long range dosage effects, such as back scatter and fogging. In another embodiment the target dosage map 602 may be initialized with dosages from one or more shots determined without use of a dosage map. As can be seen from the target surface dosage map 602, with a resist threshold of 0.6, the pattern that the resist registers will be smoother than the union of the outline of the individual shots. For example, the interior corners of the unioned shot pattern will be substantially filled in, since the dosages in these grid positions is either 0.6 or 1.0. This dosage map 602 illustrates that the pattern registered on the resist from this set of six shots will approximate, in the middle portion, a constant width line angled 45 degrees with respect to the Cartesian axes. Creation of the one-shot dosage map 502, such as by using charged particle beam simulation, allows calculation of the dosage map 602 by combining each of six copies or instances of the dosage map 502 into the initial target surface dosage map 602. This may be computationally faster than simulating the collection of six VSB shots using charged particle beam simulation.

Figure 7A:
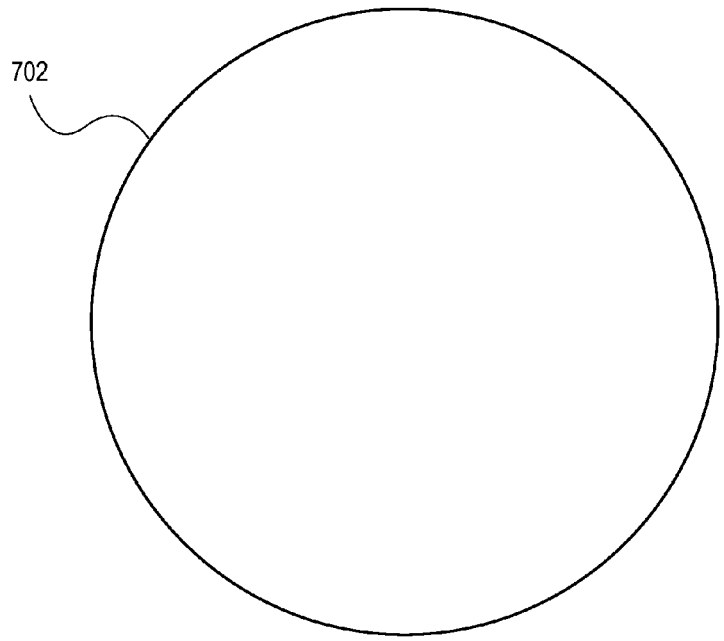
FIG. 7A illustrates a circular pattern.
Figure 7B:
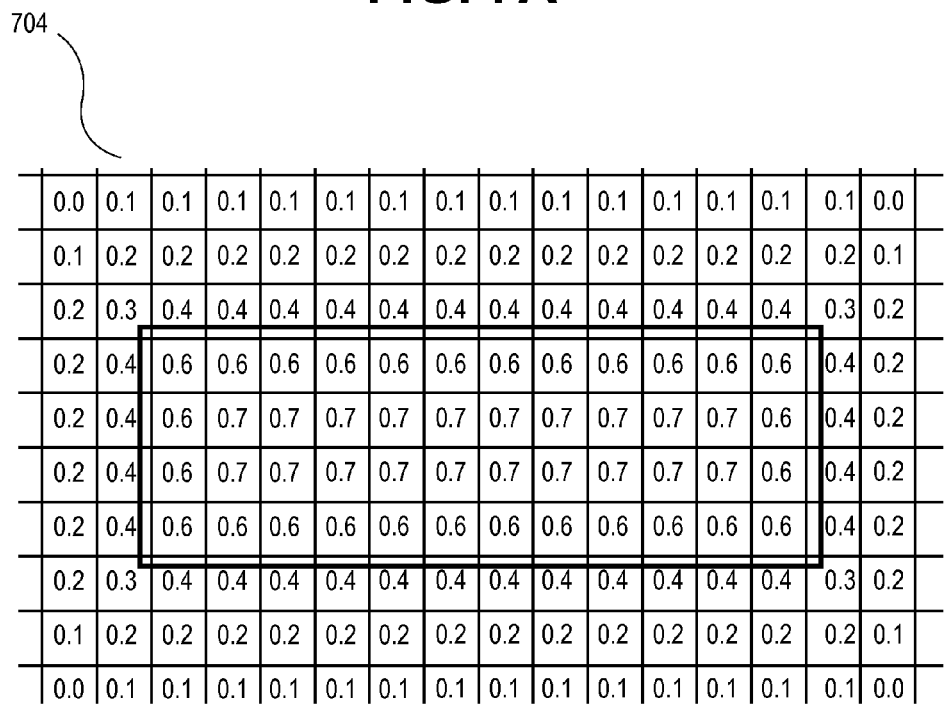
FIG. 7B illustrates the dosage map of a rectangular shot.
Figure 7C:
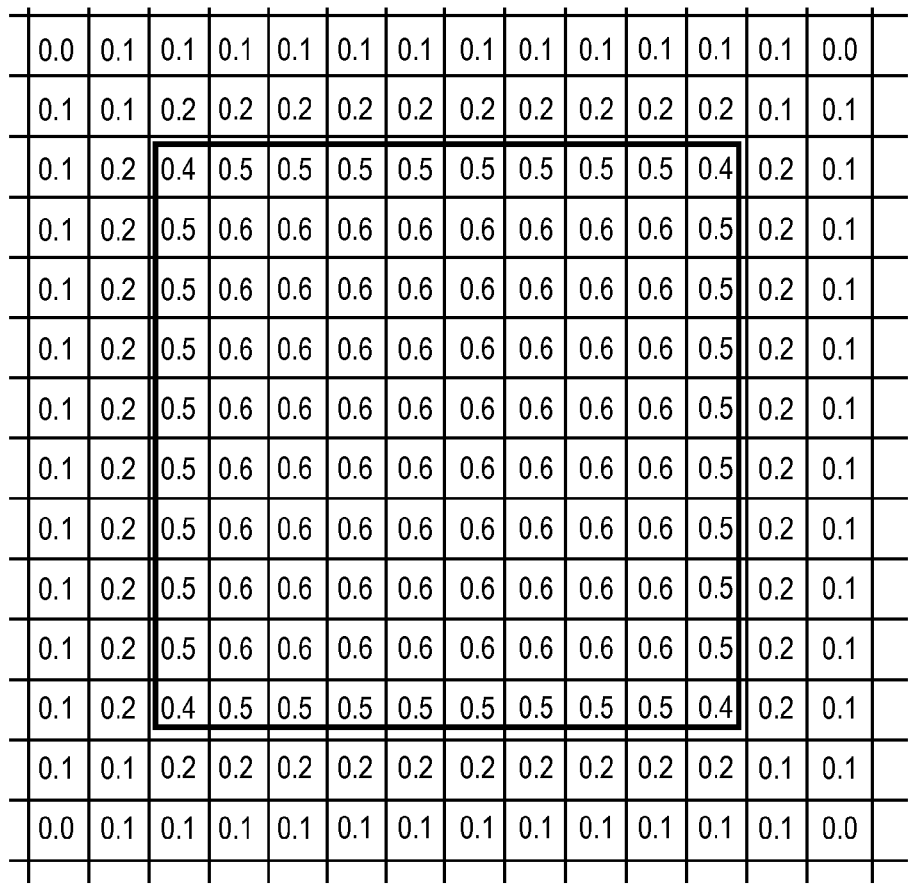
FIG. 7C illustrates the dosage map of a square shot.
Figure 7D:
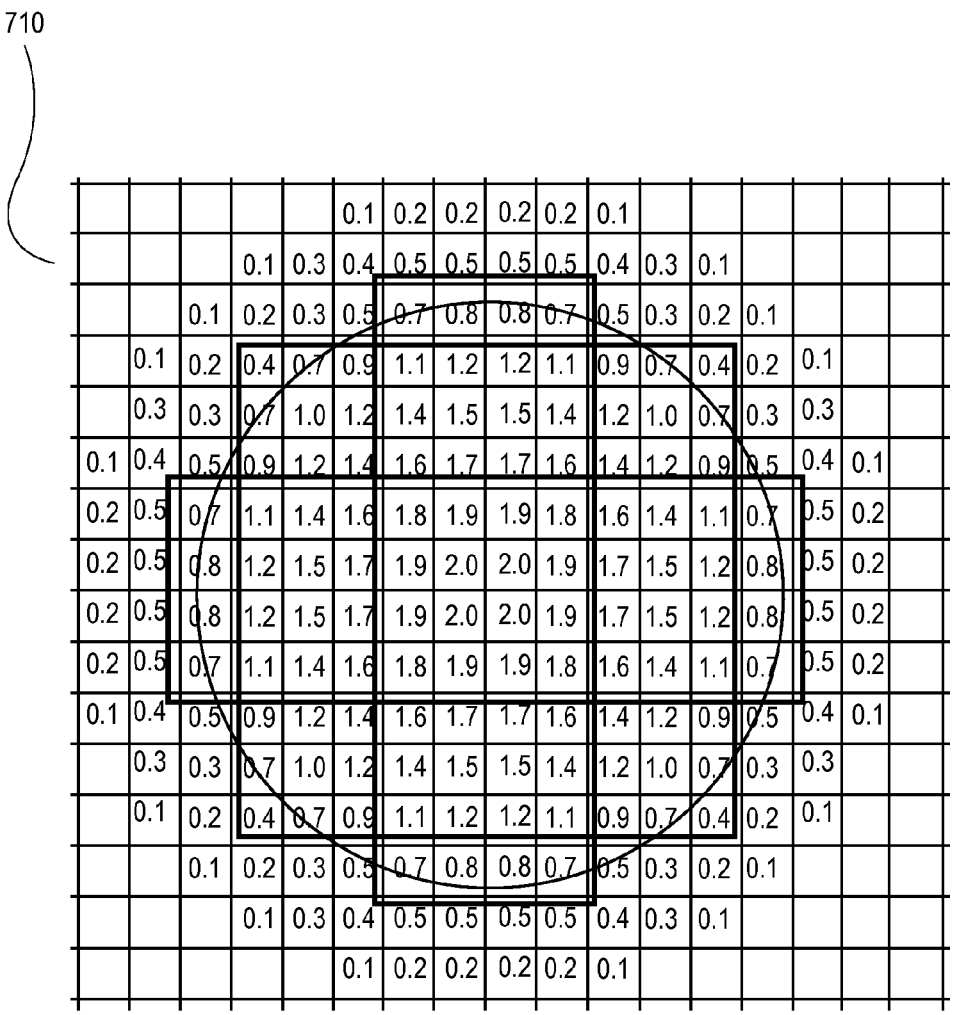
FIG. 7D illustrates the dosage map of three overlapping shots of FIGS. 7B and 7C that can form the circular pattern of FIG. 7A.

FIGS. 7A-D illustrate another example of combining dosage maps as an embodiment of the present disclosure. FIG. 7A shows a desired circular pattern 702. FIG. 7B shows a dosage map 704 of a rectangular shot that can be used in a plurality of shots to create the pattern 702. The nominal shot dosage for the shot represented in the dosage map 704 is 0.7, meaning 0.7 times a normal dose. FIG. 7C shows a dosage map 706 for a square shot with a nominal shot dosage of 0.6. FIG. 7D shows a combined dosage map 710 resulting from the combination of three dosages maps from three overlapping shots: a) the dosage map 704 of the rectangular shot, b) a 90 degree rotated version of dosage map 704, and c) dosage map 706 of the square shot. If a resist with a threshold of 0.7 is used, a pattern similar to the desired circular pattern 702 will be registered on the resist per the combined dosage map 710. In this example the shots represented by dosage maps 704 and 706 use a dosage less than 1.0, so as to limit the maximum dosage to 2.0 in the area where all three shots overlap, as shown in dosage map 710. Some photomask production processes limit the maximum combined dosage to values such as 2.0 times the normal dosage. FIG. 7D also illustrates how the length of the two non-square rectangular shots has been made larger than the diameter of the desired circular pattern 702. The "oversizing" of these rectangles compensates for corner rounding that may occur on these shots because of the dosage of 0.7. As shown in dosage map 704, the dosage is less near the edges and in the corners of the shot, due to the Gaussian dosage fall-off near the edges of the shot. Overall, FIGS. 7A-D illustrate how a circular pattern can be calculated using a small number of shot dosage maps—in this case only two. Although FIGS. 7A-D illustrate the combination of dosage maps for a circular pattern, this method is applicable to any rectilinear or curvilinear shape or set of shapes.

Figure 9:
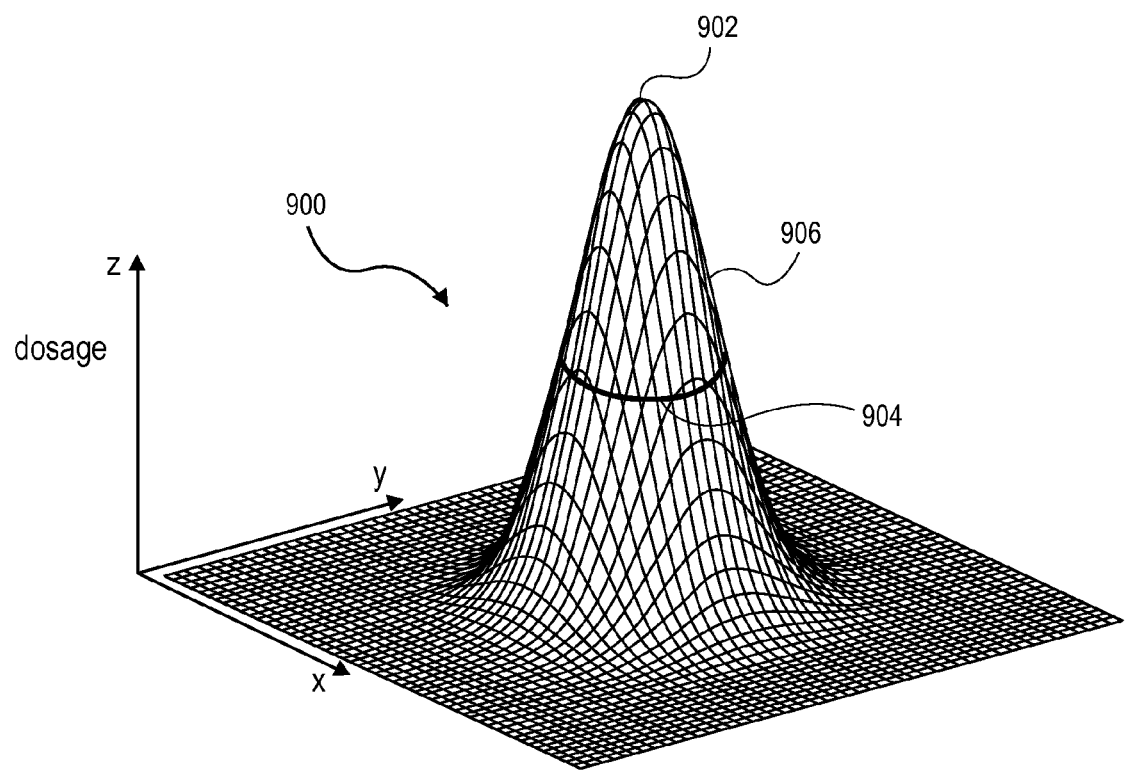
FIG. 9 illustrates a dosage graph of a glyph resulting from a circular CP character shot.

FIG. 9 illustrates in graphical form an example of a glyph. A glyph is a dosage map calculated from one or more CP and/or VSB shots, with each shot comprising a position and a shot dosage. The glyph illustrated in FIG. 9 may be, for example, calculated from a shot of a circular CP character. The glyph's two-dimensional dosage map is displayed in FIG. 9 as a dosage graph 900. The dosage graph 900 is shown in three-dimensional isometric view, with the "Z" dimension representing the dosage at each X, Y location. The center of the CP shot is point 902, which is also the point of highest calculated dosage. As can be seen, the dosage falls off in any X, Y direction from point 902. Also shown on dosage graph 900 is a resist threshold 904, which is the dosage above which resist coating a surface would register a pattern if the resist were to be exposed with only this shot. The portion of the dosage graph which is above the resist threshold 904 is marked as graph portion 906. The portion of glyph 900 which will result in a registered pattern area on a resist-coated surface is thus the projection of graph portion 906 onto the X-Y plane. As can be seen from FIG. 9, the registered pattern area created by flattening graph portion 906 is circular or nearly circular. The glyph calculated from the circular CP character and represented by the dosage graph 900 is therefore circularly symmetric or nearly circularly symmetric, and will produce a circular or nearly circular registered pattern area on the resist-coated surface.

Figure 2:
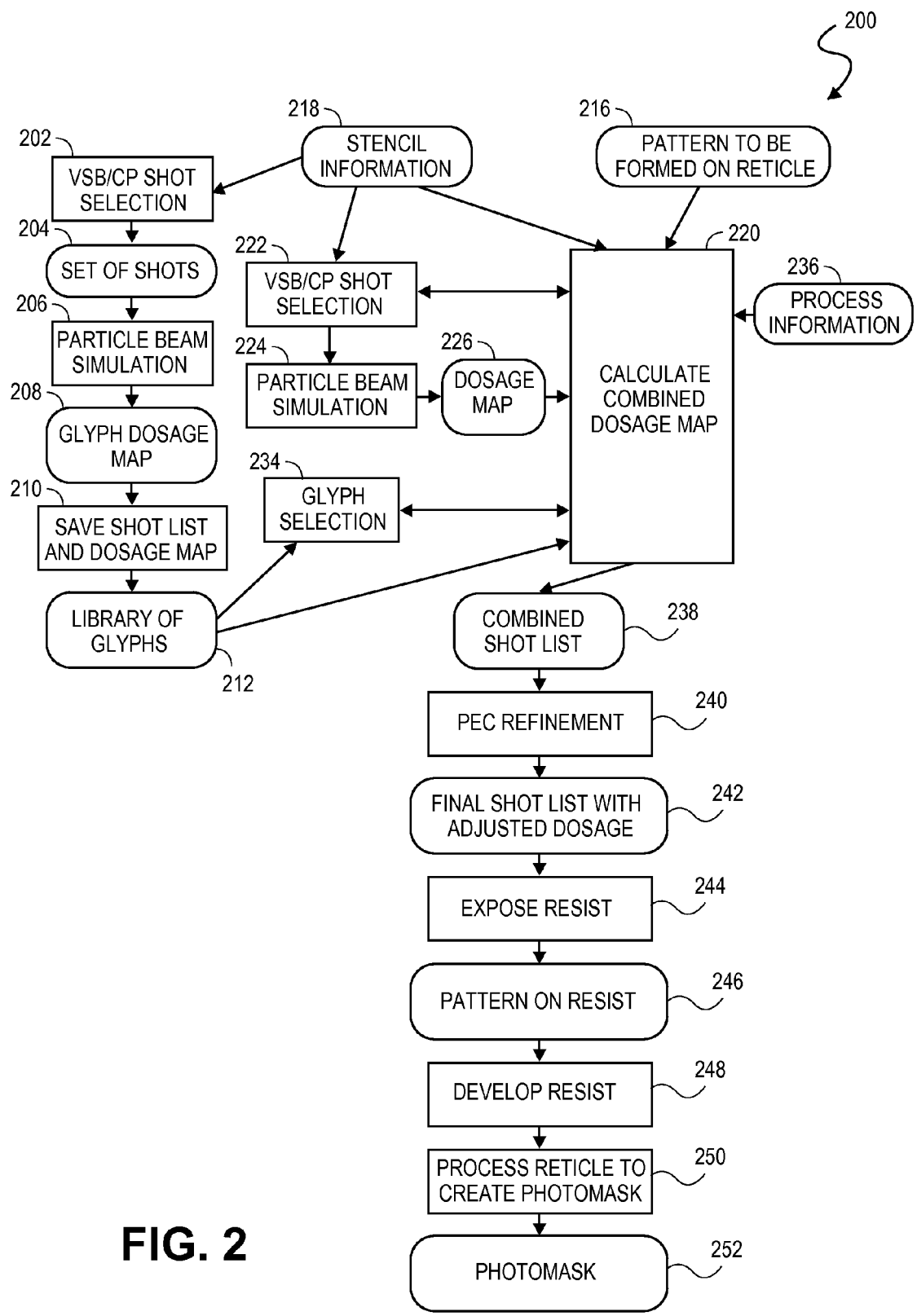
FIG. 2 illustrates a conceptual flow diagram of manufacturing a reticle and photomask using an exemplary method of the current disclosure.

FIG. 2 illustrates an exemplary conceptual flow diagram 200 of a method for manufacturing a photomask according to the current disclosure. There are three types of input data to the process: stencil information 218, which is information about the CP characters on the stencil of the charged particle beam system; process information 236, which includes information such as the resist dosage threshold above which the resist will register a pattern; and a computer representation of the desired pattern 216 to be formed on the reticle. In addition, initial optional steps shown by steps 202-212 involve the creation of a library of glyphs. The first step in the optional creation of a library of glyphs is VSB/CP shot selection 202, in which one or more VSB or CP shots, each shot with a specific dosage, are combined to create a set of shots 204. The set of shots 204 may include overlapping VSB shots and/or overlapping CP shots. The VSB/CP shot selection step uses the stencil information 218, which includes information about the CP characters that are available on the stencil. The set of shots 204 is simulated in step 206 using charged particle beam simulation to create a dosage map 208 of the set of shots. Step 206 may include simulation of various physical phenomena including forward scattering, resist diffusion, Coulomb effect and etching. The result of step 206 is a two-dimensional dosage map 208 which represents the combined dosage from the sets of shots 204 at each of the grid positions in the map. The dosage map 208 is called a glyph. In step 210 the information about each of the shots in the set of shots, and the dosage map 208 of this additional glyph is stored a library of glyphs 212. In one embodiment, a set of glyphs may be combined into a type of glyph called a parameterized glyph.

The required portion of the flow 200 involves creation of a photomask. In step 220 a combined dosage map for the reticle or reticle portion is calculated. Step 220 uses as input the desired pattern 216 to be formed on the reticle, the process information 236, the stencil information 218, and the glyph library 212 if a glyph library has been created. In step 220 a reticle dosage map may be created, into which shot dosage information, for example a shot dosage map, will be combined. In one embodiment the reticle dosage map may be initialized to zeros. In another embodiment, the grid squares of the reticle dosage map may be initialized with an estimated correction for long-range effects such as backscattering, fogging, or loading, a term which refers to the effects of localized resist developer depletion. In another embodiment, the reticle dosage map may be initialized with dosage information from one or more glyphs, or from one or more shots which have been determined without use of a dosage map. Step 220 may involve VSB/CP shot selection 222 or glyph selection 234, or both of these. If a VSB or CP shot is selected, the shot is simulated using charged particle beam simulation in step 224 and a dosage map 226 of the shot may be created. The charged particle beam simulation may comprise convolving a shape with a Gaussian. The convolution may be with a binary function of the shape, where the binary function determines whether a point is inside or outside the shape. The shape may be an aperture shape or multiple aperture shapes, or a slight modification thereof. In one embodiment, this simulation may include looking up the results of a previous simulation of the same shot, such as when using a temporary shot dosage map cache. In another embodiment, the shot dosage information may be represented in some way other than a dosage map, where this other representation allows the shot dosage information to be combined into the reticle dosage map. Both VSB and CP shots may be allowed to overlap, and may have varying dosages with respect to each other. If a glyph is selected, the dosage map of the glyph is input from the glyph library. In step 220, the various glyph dosage maps and the shot information such as shot dosage maps are combined into the reticle dosage map. In one embodiment, the combination is done by adding the dosages. Using the resulting combined dosage map and the resist information 236, a reticle pattern may be calculated. If the reticle image matches the desired pattern 216 within a pre-determined tolerance, then a combined shot list 238 is output, containing the determined VSB/CP shots and the shots constituting the selected glyphs. If the calculated reticle image does not match the target image 216 within a predetermined tolerance as calculated in step 220, the set of selected CP shots, VSB shots and/or glyphs is revised, the dosage maps are recalculated, and the reticle pattern is recalculated. In one embodiment, the initial set of shots and/or glyphs may be determined in a correct-by-construction method, so that no shot or glyph modifications are required. In another embodiment, step 220 includes an optimization technique so as to minimize either the total number of shots represented by the selected VSB/CP shots and glyphs, or the total charged particle beam writing time, or some other parameter. In yet another embodiment, VSB/CP shot selection 222 and glyph selection 234 are performed so as to generate multiple sets of shots, each of which can form a reticle image that matches the desired pattern 216, but at a lower-than-normal dosage, to support multi-pass writing.

The combined shot list 238 comprises the determined list of selected VSB shots, selected CP shots and shots constituting the selected glyphs. All the shots in the final shot list 238 include dosage information. In step 240, proximity effect correction (PEC) and/or other corrections may be performed or corrections may be refined from earlier estimates. Step 240 uses the combined shot list 238 as input and produces a final shot list 242 in which the shot dosages have been adjusted. The final shot list 242 is used by the charged particle beam system in step 244 to expose resist with which the reticle has been coated, thereby forming a pattern 246 on the resist. In step 248 the resist is developed. Through further processing steps 250 the reticle is transformed into a photomask 252.

Figure 8A:
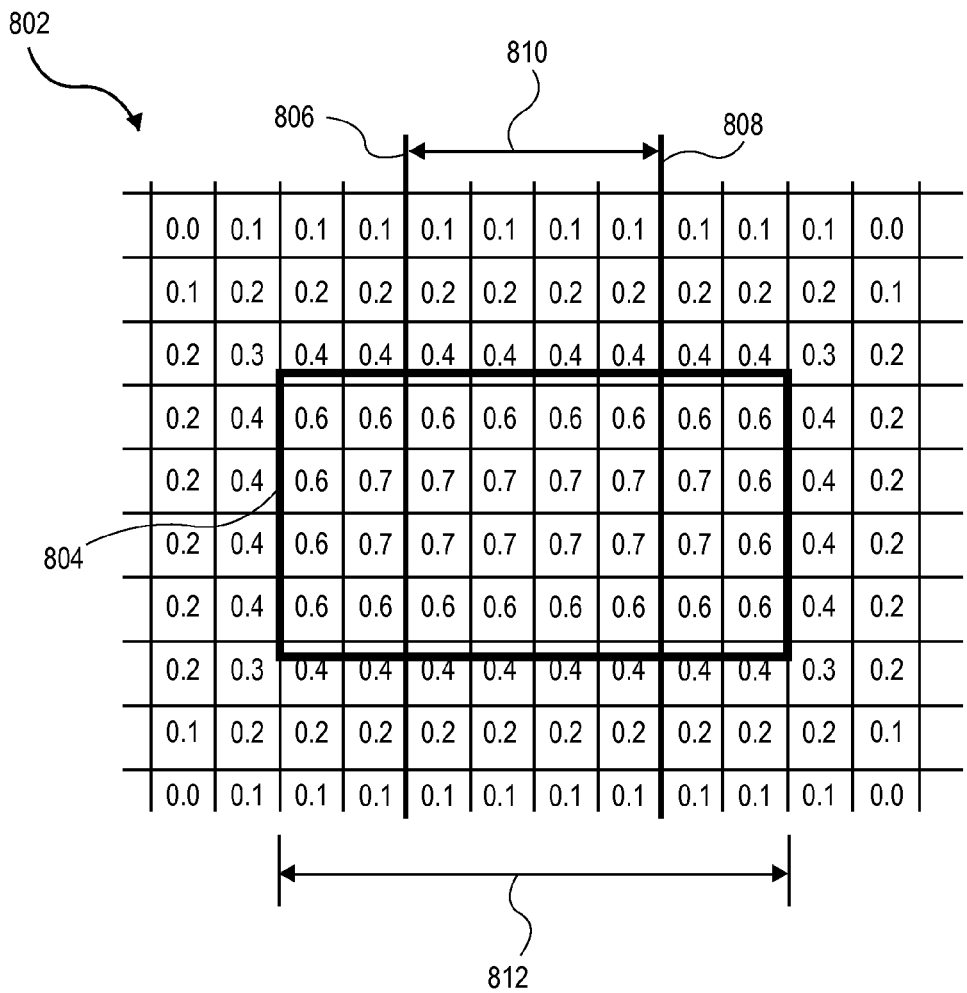
FIG. 8A illustrates a parameterized glyph dosage map.
Figure 8B:
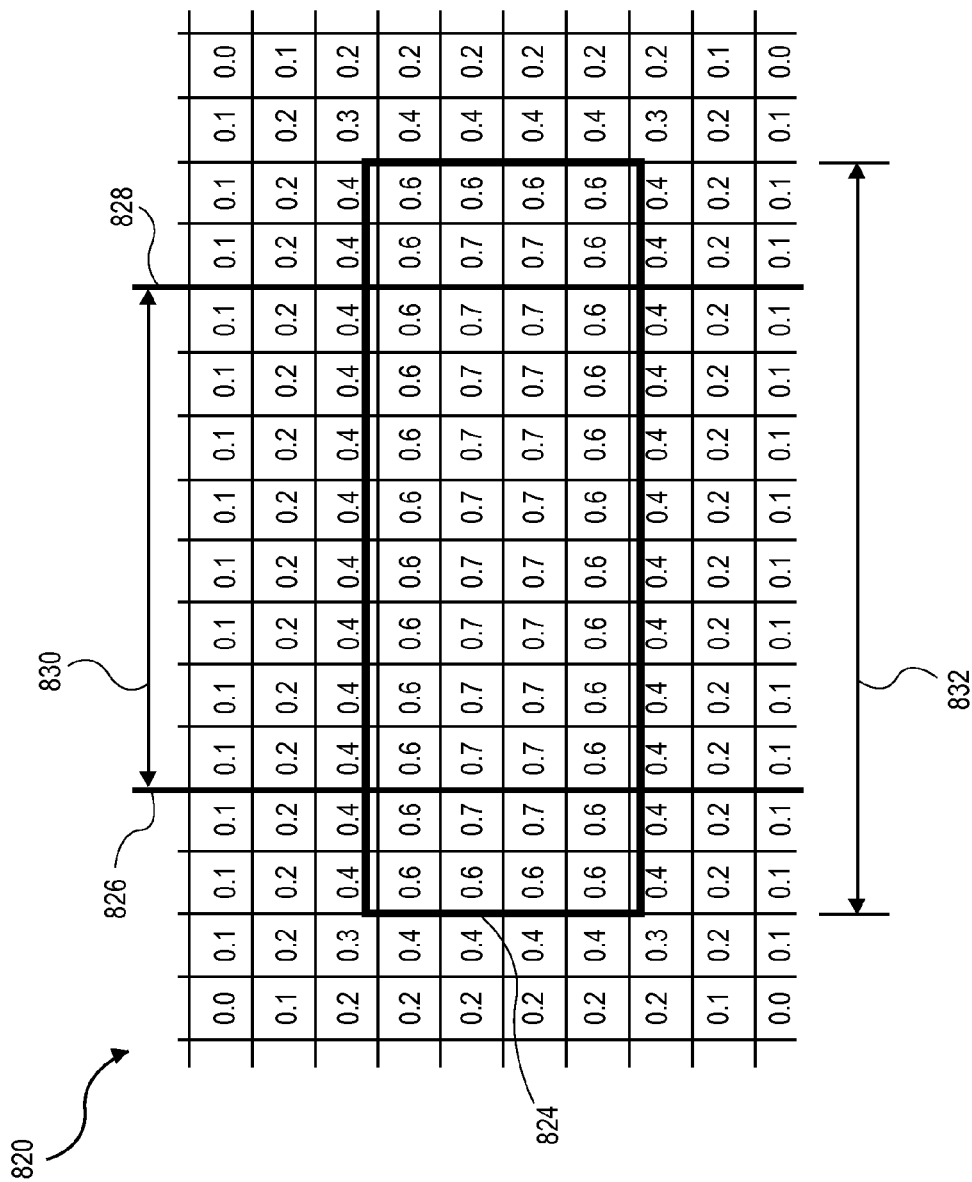
FIG. 8B illustrates another dosage map for the parameterized glyph of FIG. 8A.

FIGS. 8A & B illustrate an example of a parameterized glyph. The dosage map 802 illustrated in FIG. 8A is for a rectangular shot 804 of width 812, or eight grid units in this example. The two vertical lines 806 and 808 define a region of the dosage map which is of width 810, or four grid units in this example. Within this region 810 of the dosage map 802, all grid squares in each row have identical dosage values. FIG. 8B illustrates a dosage map 820 for a rectangular shot 824 of width 832, or twelve grid units in this example. The dosage map 820 is similar to the dosage map 802, including the dosage values of the grid squares, except that between vertical lines 826 and 828, dosage map 820 contains four more grid columns than the dosage map 802 contains between lines 806 and 808. This "stretchable" portion of the dosage map 820 is of width 830, or eight grid units in this example. By identifying a stretchable or parameterizable region where the dosages are identical along the stretchable dimension, such as the region between lines 806 and 808 of FIG. 8A or between lines 826 and 828 of FIG. 8B, a dosage map for a rectangular shot of the same height as shots 804 and 824 can be generated for shots with any width greater than 812. Limitations of the charged particle beam system may further restrict the size of the rectangular shots for which this method can be used to generate a dosage map. In other embodiments, a repeated dosage pattern in the dosage map may allow dosage maps to be generated for single shots or groups of shots of only discrete lengths, rather than of a continuous length such as the example of FIGS. 8A & B. This example shows how a dosage map for a parameterized glyph may be generated. In other embodiments, other dimensions may be parameterized, such as height or diameter.

While the specification has been described in detail with respect to specific embodiments, it will be appreciated that those skilled in the art, upon attaining an understanding of the foregoing, may readily conceive of alterations to, variations of, and equivalents to these embodiments. These and other modifications and variations to the present methods for fracturing, creating glyphs and manufacturing a surface may be practiced by those of ordinary skill in the art, without departing from the spirit and scope of the present subject matter, which is more particularly set forth in the appended claims. Furthermore, those of ordinary skill in the art will appreciate that the foregoing description is by way of example only, and is not intended to be limiting. Steps can be added to, taken from or modified from the steps in this specification without deviating from the scope of the invention. In general, any flowcharts presented are only intended to indicate one possible sequence of basic operations to achieve a function, and many variations are possible. Thus, it is intended that the present subject matter covers such modifications and variations as come within the scope of the appended claims and their equivalents.

What is claimed is:

1. A method for fracturing or mask data preparation or optical proximity correction comprising the steps of:
   inputting a target maximum dosage for a surface; and
   determining a plurality of variable shaped beam (VSB) shots for a charged particle beam writer, wherein the plurality of VSB shots forms a pattern on the surface, wherein at least two shots in the plurality of VSB shots partially overlap, and wherein the plurality of VSB shots is determined such that a maximum dosage produced on the surface by the plurality of VSB shots is less than the target maximum dosage.

2. The method of claim 1 wherein the at least two shots partially overlap within an exposure pass.

3. The method of claim 1 wherein the step of determining comprises calculating the maximum dosage on the surface, and wherein the calculating is performed by one or more computing hardware processors.

4. The method of claim 3 wherein the maximum dosage on the surface is calculated within an exposure pass.

5. The method of claim 3 wherein the maximum dosage on the surface is calculated using charged particle beam simulation.

6. The method of claim 5 wherein the charged particle beam simulation includes at least one of the group consisting of forward scattering, resist diffusion, Coulomb effect, and etching.

7. The method of claim 1 wherein each shot in the plurality of VSB shots comprises a dosage information, before proximity effect correction (PEC).

8. The method of claim 7 wherein the step of determining comprises calculating the maximum dosage on the surface, and wherein calculating the maximum dosage on the surface comprises combining the dosage information for the at least two partially-overlapping shots.

9. The method of claim 7 wherein the step of determining comprises calculating the dosage information for the least two partially-overlapping shots using charged particle beam simulation.

10. The method of claim 8 wherein the dosage information for the at least two partially-overlapping shots is combined into a dosage map.

11. The method of claim 7 wherein the dosage information for a pair of shots in the plurality of VSB shots differ.

12. A method for manufacturing an integrated circuit using an optical lithographic process, the optical lithographic process using a reticle, the method comprising the steps of:
   inputting a target maximum dosage for a reticle;
   determining a plurality of variable shaped beam (VSB) shots, wherein the plurality of VSB shots forms a pattern on the reticle, wherein at least two shots in the plurality of VSB shots partially overlap, and wherein the plurality of VSB shots is determined such that a maximum dosage produced on the surface by the plurality of VSB shots is less than the target maximum dosage; and
   forming the pattern on the reticle with the plurality of VSB shots.

13. The method of claim 12 wherein the at least two shots partially overlap within an exposure pass.

14. The method of claim 12 wherein the step of determining comprises calculating the maximum dosage on the reticle.

15. The method of claim 14 wherein the maximum dosage on the reticle is calculated within an exposure pass.

16. The method of claim 14 wherein the maximum dosage on the reticle is calculated using charged particle beam simulation.

17. The method of claim 16 wherein the charged particle beam simulation includes at least one of the group consisting of forward scattering, resist diffusion, Coulomb effect, and etching.

18. The method of claim 12 wherein each shot in the plurality of VSB shots comprises a dosage information, before proximity effect correction (PEC).

19. The method of claim 18 wherein the step of determining comprises calculating the maximum dosage on the reticle, and wherein calculating the maximum dosage on the reticle comprises combining the dosage information for the at least two partially-overlapping shots.

20. The method of claim 18 wherein the step of determining comprises the step of calculating the dosage information for the least two partially-overlapping shots using charged particle beam simulation.

21. The method of claim 19 wherein the dosage information for the at least two partially-overlapping shots is combined into a dosage map.

22. The method of claim 18 wherein the dosage information for a pair of shots in the plurality of VSB shots differ.

23. A system for fracturing or mask data preparation or optical proximity correction comprising
a device configured to determine a plurality of variable shaped beam (VSB) shots, wherein the plurality of VSB shots forms a pattern on the surface, wherein at least two shots in the plurality of VSB shots partially overlap, wherein the plurality of VSB shots is determined such that a maximum dosage produced on the surface by the plurality of VSB shots is less than a desired maximum dosage.

24. The system of claim 23 wherein the device configured to determine assigns a dosage information to each shot in the plurality of VSB shots.

25. The system of claim 23, wherein the device configured to determine calculates the maximum dosage on the surface.

26. The system of claim 25 wherein the maximum dosage on the surface is calculated within an exposure pass.

27. The system of claim 25 wherein the maximum dosage on the surface is calculated using charged particle beam simulation.

* * * * *